United States Patent [19]

Sako et al.

[11] Patent Number: 4,541,092
[45] Date of Patent: Sep. 10, 1985

[54] METHOD FOR ERROR CORRECTION

[75] Inventors: Yoichiro Sako, Tokyo; Kentaro Odaka, Kanagawa, both of Japan

[73] Assignee: Sony Corporation, Tokyo, Japan

[21] Appl. No.: 615,670

[22] Filed: May 31, 1984

Related U.S. Application Data

[63] Continuation of Ser. No. 396,004, Jul. 7, 1982, abandoned.

[30] Foreign Application Priority Data

Aug. 14, 1981 [JP] Japan .................................. 56-127595

[51] Int. Cl.³ .............................................. G06F 11/10
[52] U.S. Cl. ............................................ 371/39; 371/37
[58] Field of Search ............... 371/41, 38, 39, 40, 371/37

[56] References Cited

U.S. PATENT DOCUMENTS

| | | | |
|---|---|---|---|
| 3,078,443 | 2/1963 | Rose | 371/41 |
| 3,496,549 | 2/1970 | Tong | 371/41 |
| 3,988,677 | 10/1976 | Fletcher et al. | 371/40 |
| 4,206,440 | 6/1980 | Doi et al. | 371/38 |
| 4,238,852 | 12/1980 | Iga et al. | 371/40 |
| 4,306,305 | 12/1981 | Doi et al. | 371/38 |
| 4,330,860 | 5/1982 | Weda et al. | 371/39 |
| 4,336,612 | 6/1982 | Inoue et al. | 371/39 |
| 4,355,392 | 10/1982 | Doi et al. | 371/45 |
| 4,356,564 | 10/1982 | Doi et al. | 371/40 |
| 4,371,930 | 2/1983 | Kim | 371/38 |
| 4,380,071 | 4/1983 | Odaka | 371/40 |
| 4,398,292 | 8/1983 | Doi et al. | 371/39 |
| 4,413,340 | 11/1983 | Odaka et al. | 371/39 |
| 4,437,185 | 3/1984 | Sako et al. | 371/39 |

Primary Examiner—Michael R. Fleming
Attorney, Agent, or Firm—Lewis H. Eslinger; Alvin Sinderbrand

[57] ABSTRACT

A method of error correcting pulse code modulated data is provided in which the data words and check words are encoded in an error correcting block. The encoded data words may have one of at least two error conditions associated therewith, and the presence of each type of error condition is detected for each word. A corresponding pointer identifying one of these error conditions is added to the data words. In subsequent processing, the kinds of pointers added are discriminated, and the data words are processed on the basis of the results of this discrimination to correct or compensate for error conditions in the data words.

13 Claims, 10 Drawing Figures

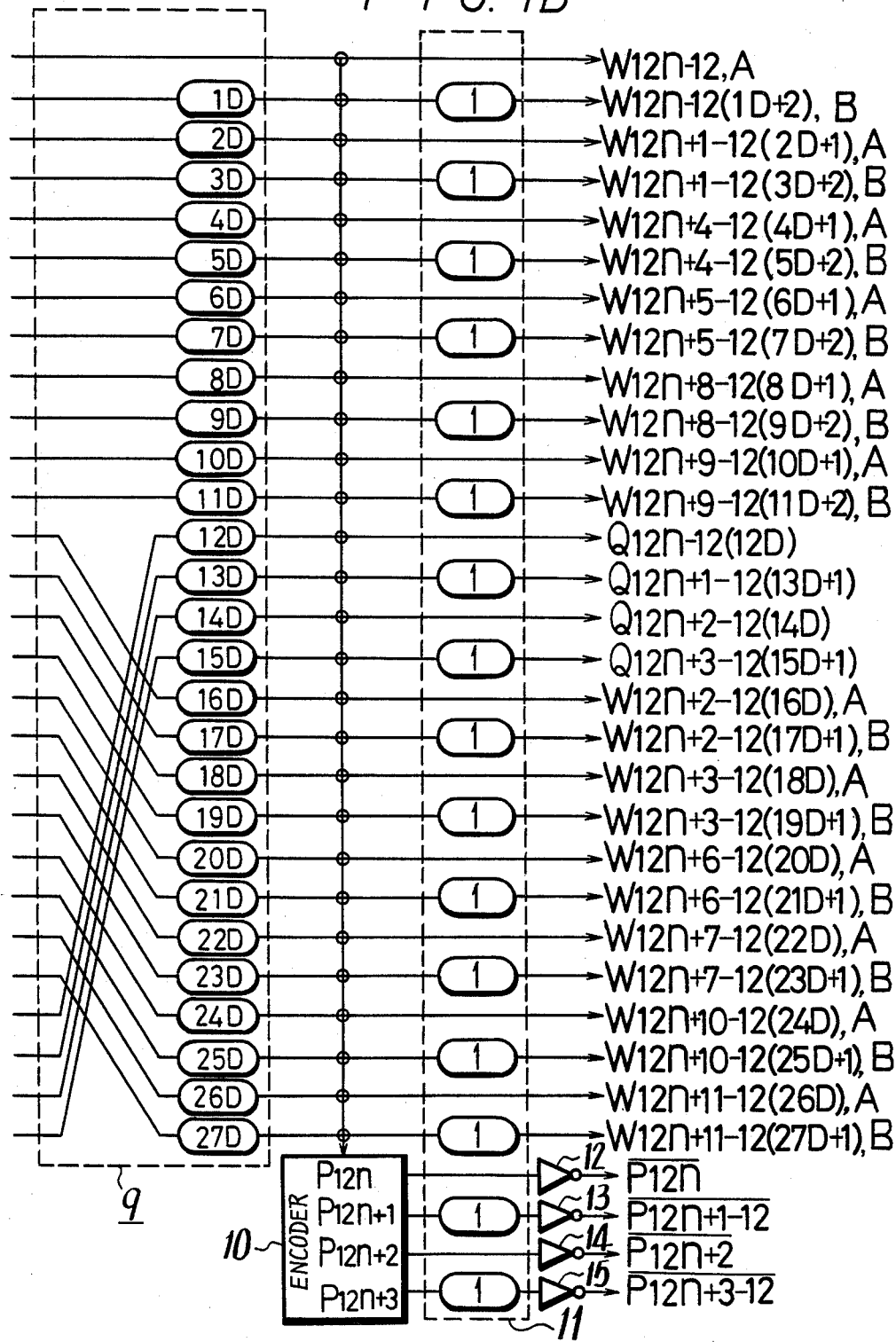

FIG. 2

| 16 Bits | | | | | | | | | | | | | | | | |
|---|---|---|---|---|---|---|---|---|---|---|---|---|---|---|---|---|
| SYNC | $U_1$ | $U_2$ | $U_3$ | $U_4$ | $U_5$ | $U_6$ | $U_7$ | $U_8$ | ---- | $U_{27}$ | $U_{28}$ | $U_{29}$ | $U_{30}$ | $U_{31}$ | $U_{32}$ |

←—— One Transmission Block  ( 8×32+16 = 272 Bits )——→

FIG. 5

$$H_{c2} \cdot V^T = \begin{bmatrix} S_{20} \\ S_{21} \\ S_{22} \\ S_{23} \end{bmatrix}$$

$$= \begin{bmatrix} \alpha^{27} & \alpha^{26} & \alpha^{25} & \alpha^{24} & \alpha^{23} & \alpha^{22} & --- & \alpha^4 & \alpha^3 & \alpha^2 & \alpha^1 & | \\ \alpha^{54} & \alpha^{52} & \alpha^{50} & \alpha^{48} & \alpha^{46} & \alpha^{44} & --- & \alpha^8 & \alpha^6 & \alpha^4 & \alpha^2 & | \\ \alpha^{81} & \alpha^{78} & \alpha^{75} & \alpha^{72} & \alpha^{69} & \alpha^{66} & --- & \alpha^{12} & \alpha^9 & \alpha^6 & \alpha^3 & | \end{bmatrix} \begin{bmatrix} W_{12n-12, A} \\ W_{12n-12, B} \\ W_{12n+1-12, A} \\ W_{12n+1-12, B} \\ W_{12n+4-12, A} \\ W_{12n+4-12, B} \\ W_{12n+5-12, A} \\ W_{12n+5-12, B} \\ W_{12n+8-12, A} \\ W_{12n+8-12, B} \\ W_{12n+9-12, A} \\ W_{12n+9-12, B} \\ W_{12n+2, A} \\ W_{12n+2, B} \\ W_{12n+3, A} \\ W_{12n+3, B} \\ W_{12n+6, A} \\ W_{12n+6, B} \\ W_{12n+7, A} \\ W_{12n+7, B} \\ W_{12n+10, A} \\ W_{12n+10, B} \\ W_{12n+11, A} \\ W_{12n+11, B} \\ Q_{12n} \\ Q_{12n+1} \\ Q_{12n+2} \\ Q_{12n+3} \end{bmatrix}$$

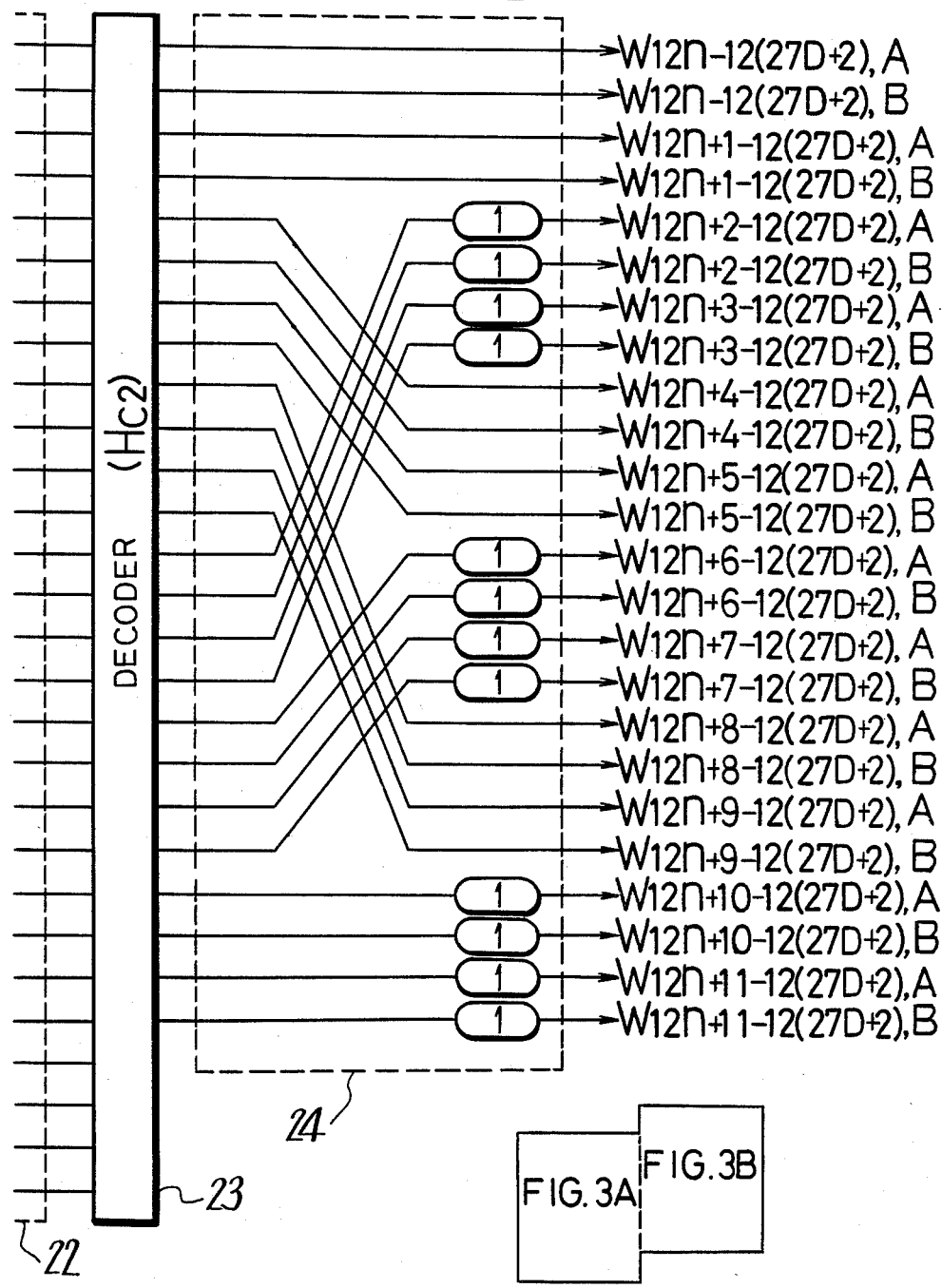

FIG. 4

$$H_{c1} \cdot V^T = \begin{bmatrix} S_{10} \\ S_{11} \\ S_{12} \\ S_{13} \end{bmatrix}$$

$$= \begin{bmatrix} \alpha^{31} & \alpha^{30} & \alpha^{29} & \alpha^{28} & \alpha^{27} & \cdots & \alpha^4 & \alpha^3 & \alpha^2 & \alpha^1 & | \\ \alpha^{62} & \alpha^{60} & \alpha^{58} & \alpha^{56} & \alpha^{54} & \cdots & \alpha^8 & \alpha^6 & \alpha^4 & \alpha^2 & | \\ \alpha^{93} & \alpha^{90} & \alpha^{87} & \alpha^{84} & \alpha^{81} & \cdots & \alpha^{12} & \alpha^9 & \alpha^6 & \alpha^3 & | \end{bmatrix} \begin{bmatrix} W_{12n-12,A} \\ W_{12n-12(1D+1),B} \\ W_{12n+1-12(2D+1),A} \\ W_{12n+1-12(3D+1),B} \\ W_{12n+4-12(4D+1),A} \\ W_{12n+4-12(5D+1),B} \\ W_{12n+5-12(6D+1),A} \\ W_{12n+5-12(7D+1),B} \\ W_{12n+8-12(8D+1),A} \\ W_{12n+8-12(9D+1),B} \\ W_{12n+9-12(10D+1),A} \\ W_{12n+9-12(11D+1),B} \\ Q_{12n+12\,(12D)} \\ Q_{12n+1-12(13D)} \\ Q_{12n+2-12(14D)} \\ Q_{12n+3-12(15D)} \\ W_{12n+2-12(16D),A} \\ W_{12n+2-12(17D),B} \\ W_{12n+3-12(18D),A} \\ W_{12n+3-12(19D),B} \\ W_{12n+6-12(20D),A} \\ W_{12n+6-12(21D),B} \\ W_{12n+7-12(22D),A} \\ W_{12n+7-12(23D),B} \\ W_{12n+10-12(24D),A} \\ W_{12n+10-12(25D),B} \\ W_{12n+11-12(26D),A} \\ W_{12n+11-12(27D),B} \\ P_{12n} \\ P_{12n+1} \\ P_{12n+2} \\ P_{12n+3} \end{bmatrix}$$

METHOD FOR ERROR CORRECTION

This is a continuation of application Ser. No. 06/396,004, filed July 7, 1982, abandoned.

BACKGROUND OF THE INVENTION

1. Field of the Invention

The invention relates to a method of error correction, and more particularly relates to a method of error correction for either burst or random errors wherein detection of such errors is greatly enhanced and erroneous correction is significantly reduced.

2. Description of the Prior Art

In the transmission of data, various electrical and electromagnetic disturbances can occur that degrade the quality of the transmitted data. That is, the disturbances create errors in the data. One type of error occurs when a number of bits in series are dropped from and/or added to the transmission of data. Such an error is commonly referred to as a burst error. Applicant of the present invention has previously proposed a cross-interleave technique which substantially maintains the original quality of the transmitted data when burst errors occur.

In the cross-interleave technique one word contained in each pulse code modulated (PCM) data series in a plurality of channels in a first arrangement state is supplied to a first error correcting encoder so as to produce a first series of check words. The first series of check words and the PCM data series in the plurality of channels are then arranged in a second arrangement state such that one word contained therein is supplied to a second error correcting encoder to provide a second series of check words. That is, a double interleave (rearrangements of check word and data) technique is performed by word unit. Therefore, the interleave technique provides dispersion and transmission of check words and PCM data contained in a common error correcting block. Such an encoding technique provides, after decoding of the data, a reduction in the number of error words in the plurality of words contained in the common error correcting block. In particular, when burst errors occur in the transmission of data, such burst errors will be dispersed due to the interleaving technique. If the interleave technique is performed twice, the first and second check words, respectively, constitute independent error correcting blocks so that errors not corrected by one series of check words, can be corrected by the other series of check words. Thus the error correcting ability is significantly improved.

However, in such a cross-interleave technique if only one bit is erroneous in a word containing, for example, eight bits, the entire word is treated as erroneous, so that for received data which contains relatively many random errors, far too many data bits are labeled as erroneous resulting in a limited error correcting ability.

Therefore, it is desirable to combine an error correcting code, such as a kind of b-adjacent code, having a high error correcting ability that corrects K words within one block, for instance, up to two word errors, and when the error location is known, M words, for instance, up to four word errors, with the foregoing cross or multi-interleave technique. When only one word error is intended to be corrected, the above error correcting code includes a feature which significantly simplifies construction of the decoder.

Additionally, when a second error correcting block is decoded at the first decoding stage and arranged once again in the first arrangement state so as to decode a first error correcting block at the next stage of decoding, the existence or presence of an error in the data therein may be identified as the absence of error, that is, as non-detection of an error or, four word errors may be detected as only one word error and thereby cause an erroneous correction. Such non-detection or erroneous correction can cause additional non-detection of errors or erroneous corrections during the next stage of decoding and thereby significantly increase the likelihood that such errors will occur. Moreover, as the number of words that require correction increases, the probability of non-detection of errors and erroneous correction is increased. Furthermore, if transmitted audio PCM signals are erroneously corrected upon transmission thereof, abnormal and undesirable sound signals are reproduced.

OBJECTS AND SUMMARY OF THE INVENTION

Accordingly, it is an object of this invention to provide a method of error correction which obviates the aforesaid defects inherent in the previously proposed method.

More specifically, it is an object of this invention to provide a method of error correction which can effectively correct random as well as burst errors.

It is another object of this invention to provide a method of error correction which significantly reduces the probability of non-detection of an error and of erroneous correction of data.

A further object of this invention is to provide a method of error correction which is free from abnormal sounds caused by an errorneous correction upon transmission of audio PCM signals.

According to an aspect of this invention, a method of error correction corrects data which has been arranged into a first error correcting block that includes a first arrangement state containing one word from each of the pulse code modulated (PCM) data sequences in a plurality of channels and first check words associated therewith; wherein each channel of the first error correcting block has been delayed by different delay times to form a second arrangement state and arranged into a second error correcting block which includes the second arrangement state and second check words associated therewith. The arranged and delayed data is corrected by a method of error correction comprising the steps of:

decoding the second error correcting block in a first stage of decoding;

delaying the PCM data sequences in the plurality of channels and the first check word sequences, which are in the second arrangement state, by different delay times at each channel so as to arrange the same into the first arrangement state; and decoding the first error correcting block in the next stage of decoding; wherein;

the first stage of decoding corrects at least one word errors contained in the second error correcting block and detects errors of more than two words; and adds to each word a pointer of one of two kinds which distinguishes between correction of one word errors from detection of more than two word errors;

and further wherein the next stage of decoding corrects word errors contained in the first error correcting block; and discriminates the number and arrangement state of the pointers of two kinds contained in the first error correcting block during the error correcting process, so that on the basis of the discrimination results, substantially all errors are detected and erroneous correction as data is avoided.

The above, and other objects, features and advantages of the present invention will become apparent from the following description taken in conjunction with the accompanying drawings in which like numerical references designate the same elements and parts.

BRIEF DESCRIPTION OF THE DRAWINGS

FIG. 1, which includes FIGS. 1A and 1B, is a block diagram showing an error correcting encoder in accordance with the present invention;

FIG. 2 is a block diagram showing an arrangement of data upon transmission thereof in accordance with FIG. 1;

FIG. 3, which includes FIGS. 3A and 3B, is a block diagram showing an error correcting decoder that decodes the data of FIG. 1 in accordance with the present invention;

FIGS. 4 and 5 are matrices which explain the operation of the error correcting decoder in accordance with the present invention.

DESCRIPTION OF THE PREFERRED EMBODIMENT

Figure 1A:
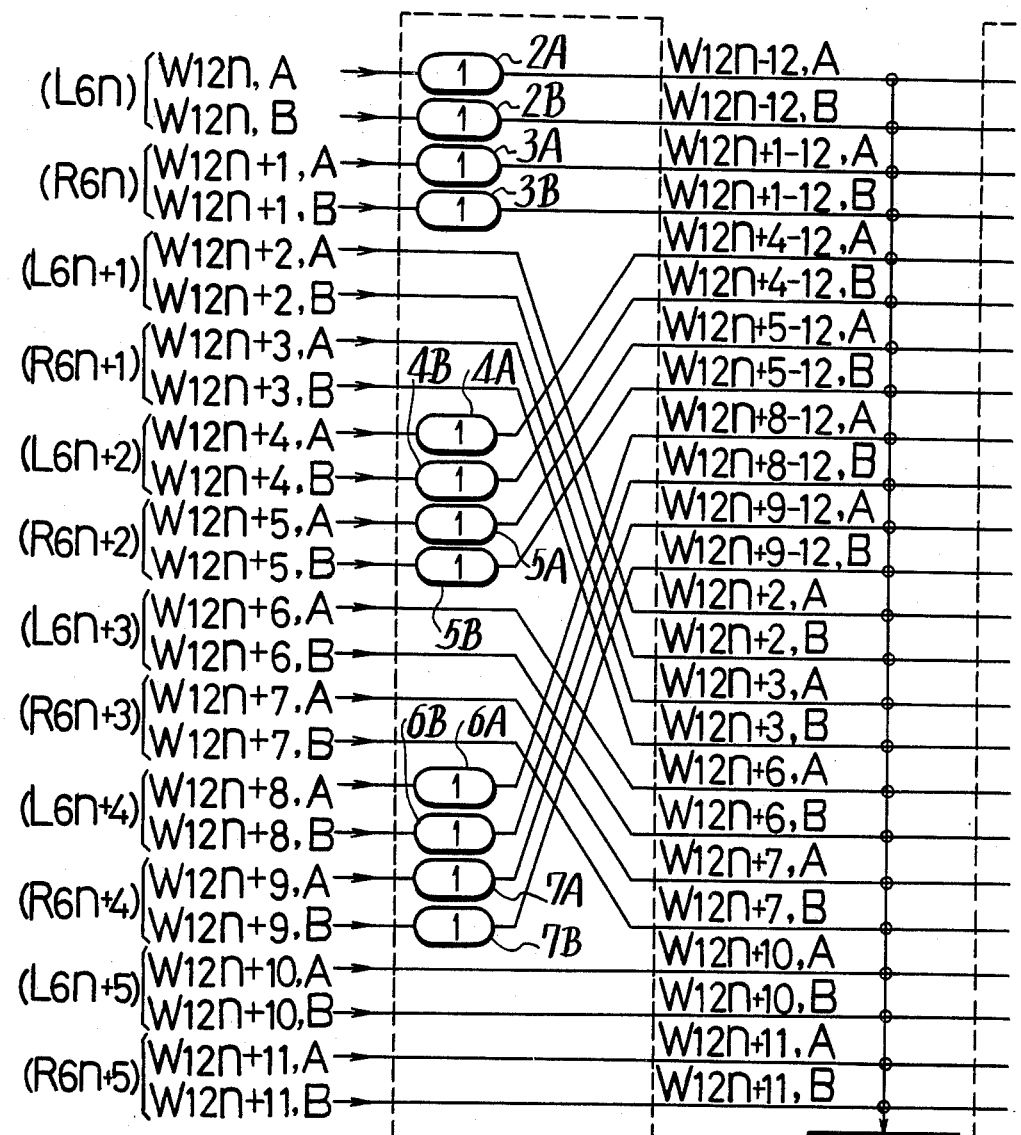

Generally, in describing an error correcting code, an expression in terms of a vector representation or cyclic group is employed. For examples, on Galois field GF(2) which includes an irreducible polynomial $F(x)$ of m order and where there exist only elements of "0" and "1", the irreducible polynomial $F(x)$ has no root. Therefore, a hypothetical or imaginary root $\alpha$ which satisfies $F(x) = 0$ is considered. Elements $0, \alpha, \alpha^2, \alpha^3 \ldots \alpha^{2^m-1}$ of $2^m$ numbers, each of which differs from one another and is expressed by a power $\alpha$ including the zero element, constitute an extension field $GF(2^m)$. The extension field $GF(2^m)$ is the polynomial ring taking the irreducible polynomial $F(x)$ of m order on the Galois field GF(2) as a modulus. The elements of the extension field $GF(2^m)$ can be written by a linear combination of $$1, \alpha = \{x\}, \alpha^2 = \{x^2\}, \ldots, \alpha^{m-1} = \{x^{m-1}\}$$

that is $$a_0 + a_1\{x\} + a_2\{x^2\} + \ldots + a_{m-1}\{x^{m-1}\} = a_0 + a_1\alpha + a_2\alpha^2 + \ldots + a_{m-1}\alpha^{m-1}$$

or $$(a_{m-1}, a_{m-2}, \ldots, a_2, a_1, a_0)$$

where $$a_0, a_1, \ldots, a_{m-1} \in GF(2).$$

By way of example, for an extension field $GF(2^8)$ the irreducible polynomial can be expressed by $\mathrm{mod}.F(x) = x^8 + x^4 + x^3 + x^2 + 1$ and all data of 8 bits can be written as $$a_7x^7 + a_6x^6 + a_5x^5 + a_4x^4 + a_3x^3 + a_2x^2 + a_1x + a_0$$

or $$(a_7, a_6, a_5, a_4, a_3, a_2, a_1, a_0)$$

wherein $a_7$ is assigned to the side of the most significant bit (MSB) and $a_0$ to the side of the least significant bit (LSB). In this case, $a_n$ belongs to the Galois field GF(2) and it is therefore either "0" or "1".

Also, from the polynomial $F(x)$ the following matrix of m×m is derived:

$$T = \begin{pmatrix} 0 & 0 & \ldots & 0 & a_0 \\ 1 & 0 & \ldots & 0 & a_1 \\ 0 & 1 & \ldots & 0 & a_2 \\ \cdot & \cdot & & \cdot & \cdot \\ \cdot & \cdot & & \cdot & \cdot \\ \cdot & \cdot & & \cdot & \cdot \\ 0 & 0 & \ldots & 1 & a_{m-1} \end{pmatrix}$$

There is another expression which uses the cyclic group, which takes advantage of the fact that the remainder elements, excluding the zero element from the extension field $GF(2^m)$, form a multiplicative group of order $2^m - 1$. If the elements of the extension field $GF(2^m)$ are represented by the use of the cyclic group, they become:

$$0, 1(=\alpha^{2^m-1}), \alpha, \alpha^2, \alpha^3, \ldots \alpha^{2^m-2}.$$

In accordance with one example of this invention, when m bits constitute one word and n words constitute one block, k check words are produced on the basis of the following parity check matrix:

$$H = \begin{pmatrix} 1 & 1 & \ldots & 1 & 1 \\ \alpha^{n-1} & \alpha^{n-2} & \ldots & \alpha & 1 \\ \alpha^{2(n-1)} & \alpha^{2(n-2)} & \ldots & \alpha^2 & 1 \\ \cdot & \cdot & & \cdot & \cdot \\ \cdot & \cdot & & \cdot & \cdot \\ \cdot & \cdot & & \cdot & \cdot \\ \alpha^{(k-1)(n-1)} & \alpha^{(k-1)(n-2)} & \ldots & \alpha^{k-1} & 1 \end{pmatrix}$$

Also, by using the matrix T, the parity check matrix H is similarly expressed as:

$$H = \begin{pmatrix} I & I & \ldots & I & I \\ T^{n-1} & T^{n-2} & \ldots & T^1 & I \\ T^{2(n-1)} & T^{2(n-2)} & \ldots & T^2 & I \\ \cdot & \cdot & & \cdot & \cdot \\ \cdot & \cdot & & \cdot & \cdot \\ \cdot & \cdot & & \cdot & \cdot \\ T^{(k-1)(n-1)} & T^{(k-1)(n-2)} & \ldots & T^{k-1} & I \end{pmatrix}$$

where letter I represents a unit matrix of (m×m).

As stated above, the representation using the root $\alpha$ and that using the generating matrix H are both essentially the same as one another.

Further, when there are four (k=4) check words employed, the parity check matrix H becomes:

$$H = \begin{pmatrix} 1 & 1 & \ldots 1 & 1 \\ \alpha^{n-1} & \alpha^{n-2} & \ldots \alpha & 1 \\ \alpha^{2(n-1)} & \alpha^{2(n-2)} & \ldots \alpha^2 & 1 \\ \alpha^{3(n-1)} & \alpha^{3(n-2)} & \ldots \alpha^3 & 1 \end{pmatrix}$$

Let one block of the received data be column vector $V=(W_{n-1}, W_{n-2}, \ldots W_1, W_0)$ (where $W_i = W_i \oplus e_i$, $e_i$ is error pattern). Then, four syndromes $S_0$, $S_1$, $S_2$ and $S_3$ produced at the receiving side become:

$$\begin{pmatrix} S_0 \\ S_1 \\ S_2 \\ S_3 \end{pmatrix} = H \cdot V^T$$

This error correcting code is capable of error correcting up to two word errors within one error correcting block, and when the error location is known, up to three or four word errors.

One error correcting block includes four check words ($p=W_3$, $q=W_2$, $r=W_1$ and $s=W_0$), which are obtained as follows and where $\Sigma$ means $$\sum_{i=4}^{n-1} : \begin{cases} p + q + r + s = \Sigma W_i = a \\ \alpha^3 p + \alpha^2 q + \alpha r + s = \Sigma \alpha^i W_i = b \\ \alpha^6 p + \alpha^4 q + \alpha^2 r + s = \Sigma \alpha^{2i} W_i = c \\ \alpha^9 p + \alpha^6 q + \alpha^3 r + s = \Sigma \alpha^{3i} W_i = d \end{cases}$$

Omitting the calculation process, the four check words are equal to:

$$\begin{pmatrix} p \\ q \\ r \\ s \end{pmatrix} = \begin{pmatrix} \alpha^{212} & \alpha^{153} & \alpha^{152} & \alpha^{209} \\ \alpha^{156} & \alpha^2 & \alpha^{135} & \alpha^{152} \\ \alpha^{158} & \alpha^{138} & \alpha^2 & \alpha^{153} \\ \alpha^{218} & \alpha^{158} & \alpha^{156} & \alpha^{212} \end{pmatrix} \begin{pmatrix} a \\ b \\ c \\ d \end{pmatrix}$$

The role of the encoder provided at the transmitting side is to generate the check words p, q, r and s as expressed above.

A fundamental algorithm used for data containing the check words and which can be transmitted and received is described below more specifically:

[1] For no error: $S_0 = S_1 = S_2 = S_3 = 0$

[2] For one word error, where the error pattern is represented as $e_i$: $S_0 = e_i$, $S_1 = \alpha_i e_i$, $S_2 = \alpha^{2i} e_i$, $S_3 = \alpha^{3i} e_i$. Thus $$\begin{cases} \alpha^i S_0 = S_1 \\ \alpha^i S_1 = S_2 \\ \alpha^i S_2 = S_3 \end{cases}$$

Accordingly, when i is sequentially changed, in order to identify a one word error the above relationship must be satisfied. These relationships can also be expressed as:

$$\frac{S_1}{S_0} = \frac{S_2}{S_1} = \frac{S_3}{S_2} = \alpha^i$$

By comparing the pattern of $\alpha^i$ with that previously memorized in a read-only memory (hereinafter, simply referred to as ROM), the error location i can be determined, so that the syndrome $S_0$ becomes the error pattern $e_i$.

[3] For two word errors ($e_i$ and $e_j$):

$$\begin{cases} S_0 = e_i + e_j \\ S_1 = \alpha^i e_i + \alpha^j e_j \\ S_2 = \alpha^{2i} e_i + \alpha^{2j} e_j \\ S_3 = \alpha^{3i} e_i + \alpha^{3j} e_j \end{cases}$$

Modifying the above equations $$\begin{cases} \alpha^j S_0 + S_1 = (\alpha^i + \alpha^j) e_i \\ \alpha^j S_1 + S_2 = \alpha^i (\alpha^i + \alpha^j) e_i \\ \alpha^j S_2 + S_3 = \alpha^{2i} (\alpha^i + \alpha^j) e_i \end{cases}$$

Therefore, if the following equations are established, the error is judged as two word errors and the error locations i and j are known.

$$\begin{cases} \alpha^i (\alpha^j S_0 + S_1) = \alpha^j S_1 + S_2 \\ \alpha^i (\alpha^j S_1 + S_2) = \alpha^j S_2 + S_3 \end{cases}$$

In other words, the combinations of the error locations i and j are varied to check whether the relationships among the above equations are satisified or not. The error patterns $e_i$ and $e_j$ are defined as:

$$e_i = \frac{S_0 + \alpha^{-j} S_1}{1 + \alpha^{i-j}} \quad e_j = \frac{S_0 + \alpha^{-i} S_1}{1 + \alpha^{j-i}}$$

[4] For three word errors ($e_i$, $e_j$ and $e_k$)

$$\begin{cases} S_0 = e_i + e_j + e_k \\ S_1 = \alpha^i e_i + \alpha^j e_j + \alpha^k e_k \\ S_2 = \alpha^{2i} e_i + \alpha^{2j} e_j + \alpha^{2k} e_k \\ S_3 = \alpha^{3i} e_i + \alpha^{3j} e_j + \alpha^{3k} e_k \end{cases}$$

Modifying the above equations $$\begin{cases} \alpha^k S_0 + S_1 = (\alpha^i + \alpha^k) e_i + (\alpha^j + \alpha^k) e_j \\ \alpha^k S_1 + S_2 = \alpha^i (\alpha^i + \alpha^k) e_i + \alpha^j (\alpha^j + \alpha^k) e_j \\ \alpha^k S_2 + S_3 = \alpha^{2i} (\alpha^i + \alpha^k) e_i + \alpha^{2j} (\alpha^j + \alpha^k) e_j \end{cases}$$

results in $$\begin{cases} \alpha^j(\alpha^k S_0 + S_1) + (\alpha^k S_1 + S_2) = (\alpha^i + \alpha^j)(\alpha^i + \alpha^k)e_i \\ \alpha^j(\alpha^k S_1 + S_2) + (\alpha^k S_2 + S_3) = \alpha^i(\alpha^i + \alpha^j)(\alpha^i + \alpha^k)e_i \end{cases}$$

Based on the above equations, if $$\alpha^i(\alpha^j(\alpha^k S_0 + S_1) + (\alpha^k S_1 + S_2)) = \alpha^j(\alpha^k S_1 + S_2) + (\alpha^k S_2 + S_3)$$

is established, an error can be judged as three word errors, providing $S_0 \neq 0$, $S_1 \neq 0$ and $S_2 \neq 0$. The respective error patterns $e_i$, $e_j$ and $e_k$ are determined as follows:

$$\begin{cases} \rho_i = \dfrac{S_0 + (\alpha^{-j} + \alpha^{-k})S_1 + \alpha^{-j-k}S_2}{(1 + \alpha^{i-j})(1 + \alpha^{i-k})} \\ \rho_j = \dfrac{S_0 + (\alpha^{-k} + \alpha^{-i})S_1 + \alpha^{-k-i}S_2}{(1 + \alpha^{j-i})(1 + \alpha^{j-k})} \\ \rho_k = \dfrac{S_0 + (\alpha^{-i} + \alpha^{-j})S_1 + \alpha^{-i-j}S_2}{(1 + \alpha^{k-i})(1 + \alpha^{k-j})} \end{cases}$$

In practice, the construction of the algorithm required in the correction of three word errors is complex and the correction operation thereby is rather time consuming. Accordingly, the above calculations are performed when the error locations i, j and k are known, as indicated by pointers, and the above equations are employed as a check, that is the equations are used in the error correcting operation.

[5] For four word errors ($e_i$, $e_j$, $e_k$ and $e_l$):

$$\begin{cases} S_0 = e_i + e_j + e_k + e_l \\ S_1 = \alpha^i e_i + \alpha^j e_j + \alpha^k e_k + \alpha^l e_l \\ S_2 = \alpha^{2i} e_i + \alpha^{2j} e_j + \alpha^{2k} e_k + \alpha^{2l} e_l \\ S_3 = \alpha^{3i} e_i + \alpha^{3j} e_j + \alpha^{3k} e_k + \alpha^{3l} e_l \end{cases}$$

Modifying the above equations $$\begin{cases} e_i = \dfrac{S_0 + (\alpha^{-j} + \alpha^{-k} + \alpha^{-l})S_1 + (\alpha^{-j-k} + \alpha^{-k-l} + \alpha^{-l-j})S_2 + \alpha^{-j-k-l}S_3}{(1 + \alpha^{i-j})(1 + \alpha^{i-k})(1 + \alpha^{i-l})} \\ e_j = \dfrac{S_0 + (\alpha^{-k} + \alpha^{-l} + \alpha^{-i})S_1 + (\alpha^{-k-l} + \alpha^{-l-i} + \alpha^{-i-k})S_2 + \alpha^{-k-l-i}S_3}{(1 + \alpha^{j-i})(1 + \alpha^{j-k})(1 + \alpha^{j-l})} \\ e_k = \dfrac{S_0 + (\alpha^{-l} + \alpha^{-i} + \alpha^{-j})S_1 + (\alpha^{-l-i} + \alpha^{-i-j} + \alpha^{-j-l})S_2 + \alpha^{-l-i-j}S_3}{(1 + \alpha^{k-i})(1 + \alpha^{k-j})(1 + \alpha^{k-l})} \\ e_l = \dfrac{S_0 + (\alpha^{-i} + \alpha^{-j} + \alpha^{-k})S_1 + (\alpha^{-i-j} + \alpha^{-j-k} + \alpha^{-k-i})S_2 + \alpha^{-i-j-k}S_3}{(1 + \alpha^{l-i})(1 + \alpha^{l-j})(1 + \alpha^{l-k})} \end{cases}$$

If the error locations i, j, k and l are identified by the pointers, the error correction is possible along the aforesaid calculations.

The fundamental algorithm of the error correction as set forth heretofore uses the syndromes $S_0$ to $S_3$ as a first step to check whether an error exists, to check, in a second step, whether or not the error is a one word error, and to check in the third step whether or not the error is two word errors. To correct up to two word errors, the time period required to complete all the steps is extended. Such problem of the extended time period is caused particularly when the error locations of two word errors are searched. Therefore, modified algorithm being free from such problem and very effective when applied to the case where the correction of two words errors is assumed will be described hereinafter.

Equations concerning the syndromes $S_0$, $S_1$, $S_2$ and $S_3$ for two word errors are given similarly to the above as $$\begin{cases} S_0 = e_i + e_j \\ S_1 = \alpha^i e_i + \alpha^j e_j \\ S_2 = \alpha^{2i} e_i + \alpha^{2j} e_j \\ S_3 = \alpha^{3i} e_i + \alpha^{3j} e_j \end{cases}$$

Modifying these equations $$(\alpha^i S_0 + S_1)(\alpha^i S_2 + S_3) = (\alpha^i S_1 + S_2)^2$$

Further modifying the above equation, the following error location polynomial is obtained.

$$(S_0 S_2 + S_1^2)\alpha^{2i} + (S_1 S_2 + S_0 S_3)\alpha^i + (S_1 S_3 + S_2^2) = 0$$

where coefficients of the respective equations are assumed by $$\begin{cases} S_0 S_2 + S_1^2 = A \\ S_1 S_2 + S_0 S_3 = B \\ S_1 S_3 + S_2^2 = C \end{cases}$$

Accordingly, by the use of the respective coefficients A, B and C in the above equations, it is possible to obtain the error locations for one and two word errors. That is,

[1] For no error: $A = B = C = 0$, $S_0 = 0$, and $S_3 = 0$
[2] For one word error: When $A = B = C = 0$, $S_0 \neq 0$, and $S_3 \neq 0$ are established, the error is judged as one word error. The error location i is known from $\alpha^i = S_1/S_0$ and $e_i = S_0$ is employed to correct the error.

[3] For two word errors: Inasmuch as for more than two word errors, $A \neq 0$, $B \neq 0$, and $c \neq 0$, determining the error locations for two word errors becomes remarkably simple. At this time, $$Aa^{2i}+Ba^i+C=0$$

(where $i=0\sim(n-1)$) is established. Let us assume that $B/A=D$ and $C/A=E$ are established.
Then, $$D=a^i+a^j \text{ and } E=a^i \cdot a^j.$$

Thus $$a^{2i}+Da^i+E=0.$$

Let the difference between the two error locations be t, that is, $j=i+t$.
Then, the above equations are modified as follows:

$$D=a^i(1+a^t) \text{ and } E=a^{2i+t}$$

Thus $$D^2/E=(1+a^t)^2/a^t=a^{-t}+a^t$$

Accordingly, if the ROM is previously written with values of $(a^{-t}+a^t)$ relating to the respective $(t=1\sim(n-1))$ and it is detected that the output of the ROM is coincident with values of $(D^2/E)$ calculated from the received words then the value of t is obtained. If the coincident relationship is not established, the error is regarded as more than three word errors.

Therefore, let us assume that $$X=1+a^t$$

$$Y=1+a^{-t}=D^2/E+X$$

Then $$a^i=D/X, \quad a^j=D/Y$$

Thus the error locations i and j are obtained. Additionally, the error patterns $e_i$ and $e_j$ are obtained as follows:

$$e_i=(a^jS_0+S_1)/D=S_0/Y+S_1/D$$

$$e_j=(a^iS_0+S_1)D=S_0/X+S_1/D$$

so that, error correction is possible.

In error correction of up to two word errors, the modified correcting algorithm as set forth above is capable of significantly reducing the time period required to obtain the error location as compared with the fundamental algorithm.

If the number k of the check words is increased, the error correcting ability is greatly improved. For instance, let the number k of the check words be 6. Then up to three word errors can be corrected, and further, when the error locations are known, up to six word errors can be corrected.

However in the above error correction method, detection of one word errors is to be corrected can be erroneous due to one of two possibilities. The first possibility is that errors of more than four words are detected as one word error and then corrected, while the second possibility is that errors of more than three words are detected as two word errors and then corrected. Although the latter possibility has a higher probability of occurance than the former, neither of these probabilities is relatively small.

A practical example which applies this invention to a recording/playback of an audio PCM signal will hereinafter be described with reference to the attached drawings.

FIG. 1, divided into FIGS. 1A and 1B, schematically shows an overall arrangement of an error correcting encoder used in a recording system, which is supplied at its input with an audio PCM signal. The audio PCM signal is provided by sampling both right and left stereophonic signals at a sampling frequency $f_s$ (for example, 44.1 kHz) and then converting one sample to one word (code of 2's complement formed of 16 bits). With respect to the audio signal of the left channel, the PCM data includes successive words $L_0, L_1, L_2 \ldots$, and with respect to the audio signal of the right channel, the PCM data includes successive words $R_0, R_1, R_2 \ldots$. The PCM data of the right and left channels are respectively distributed into 6 channels, so that the PCM data sequences, totaling 12 channels, are supplied to the error correcting encoder. That is, at a predetermined timing, 12 words of $L_{6n}, R_{6n}, L_{6n+1}, R_{6n+1}, L_{6n+2}, R_{6n+2}, L_{6n+3}, R_{6n+3}, L_{6n+4}, R_{6n+4}, L_{6n+5}, R_{6n+5}$ are supplied as input signals to the error correcting encoder. Additionally, each word is separated into an upper 8 bits and lower 8 bits, respectively, that is, the 12 channels are further divided into 24 channels and then processed. In brief, one word of PCM data is represented as $W_i$, and the upper 8 bits are discriminated by adding suffix A as in $W_{i,A}$, while the lower 8 bits are also discriminated by adding suffix B as in $W_{i,B}$. For example, the left channel word $L_{6n}$ is divided into two of $W_{12n,A}$ and $W_{12n,B}$.

The PCM data sequences of 24 channels are first supplied to an even-odd interleaver 1. Let n be 0, 1, 2, . . . . . Then each of $L_{6n}$ ($=W_{12n,A}$, $W_{12n,B}$), $R_{6n}$ ($=W_{12n+1,A}$, $W_{12n+1,B}$), $L_{6n+2}$ ($=W_{12n+4,A}$, $W_{12n+4,B}$), $R_{6n+2}$ ($=W_{12n+5,A}$, $W_{12n+5,B}$), $L_{6n+4}$ ($=W_{12n+8,A}$, $W_{12n+8,B}$), $R_{6n+4}$ ($=W_{12n+9,A}$, $W_{12+9,B}$) is an even-numbered word, and words other than these are odd-numbered words. The respective PCM data sequences composed of even-numbered words are delayed by one word by one word delay circuits 2A, 2B, 3A, 3B, 4A, 4B, 5A, 5B, 6A, 6B and 7A, 7B in even-odd interleaver 1. Of course, they may be delayed by larger words than one word, for example, 8 words. The even-odd interleaver 1 also converts the PCM data sequences so that 12 data sequences formed of even-numbered words share the 1st to 12th transmission channels, and the other 12 data sequences, formed of odd-numbered words, share the 13th to 24th transmission channels.

Even-odd interleaver 1 serves to prevent each of the right and left stereophonic signals from having more than two consecutive words in error and, in addition, to prevent the error from becoming uncorrectable. By way of example, consider three successive words $L_{i-1}$, $L_i$, and $L_{i+1}$. When $L_i$ is erroneous and uncorrectable, it is desirable that either $L_{i-1}$ or $L_{i+1}$ be correct. That is, in correcting the erroneous data of $L_i$, the corrected value of $L_i$ is determined through interpolation of the preceding data $L_{i-1}$ (held by the previous value) or by the mean value between the data $L_{i-1}$ and $L_{i+1}$. Delay circuits 2A, 2B through 7A, 7B of even-odd interleaver are provided so as to ensure that adjacent words are contained in different error correcting blocks. Additionally, the transmission channels are grouped in data sequences, each group formed of even numbered words and odd-numbered words, so that upon interleaving the distance between the recording positions of the adjacent even-numbered and odd-numbered words has been spaced as far apart as possible.

At the output of even-odd interleaver 1, the PCM data sequences of 24 channels, each of which is in the first arrangement state and from which the PCM data sequences are derived word by word, are supplied to a first encoder 8, which forms first check words $Q_{12n}$, $Q_{12n+1}$, $Q_{12n+2}$, $Q_{12n+3}$. The first error correcting blocks including the first check words are constructed as follows.

$(W_{12n-12,A}, W_{12n-12,B}, W_{12n+1-12,A}, W_{12n+1-12,B},$
$W_{12n+4-12,A}, W_{12n+4-12,B}, W_{12n+5-12,A}, W_{12n+5-12,B},$
$W_{12n+8-12,A}, W_{12n+8-12,B}, W_{12n+9-12,A}, W_{12n+9-12,B},$
$W_{12n+2,A}, W_{12n+2,B}, W_{12n+3,A}, W_{12n+3,B},$
$W_{12n+6,A}, W_{12n+6,B}, W_{12n+7,A}, W_{12n+7,B},$
$W_{12n+10,A}, W_{12n+10,B}, W_{12n+11,A}, W_{12n+11,B},$
$Q_{12n}, Q_{12n+1}, Q_{12n+2}, Q_{12n+3})$

First encoder 8 encodes the word number of one block: (n=28), the bit number of one word: (m=8), and the number of check words: (k=4).

The 24 PCM data sequences and 4 check word sequences are supplied to an interleaver 9. Interleaver 9 delays each data and check word sequence after the positions of the transmission channels are varied so as to interpose the check word sequences between the PCM data sequences formed of even-numbered and odd-numbered words. The delay process is implemented by inserting delay circuits having delay times of 1D, 2D, 3D, 4D, ..., 26D, 27D (where D represents a unit delay time of, for example, four words) into 27 transmission channels, respectively, other than the first transmission channel.

Interleaver 9 produces at its output 28 data sequences, each of which is in the second arrangement state, from which each word is supplied to a second encoder 10 to form second check words $P_{12n}$, $P_{12n+1}$, $P_{12n+2}$ and $P_{12n+3}$. Second error correcting block includes the above second check words and comprises 32 words as follows:

$(W_{12n-12,A}, W_{12n-12(D+1),B}, W_{12n+1-12(2D+1),A},$
$W_{12n+1-12(3D+1),B}, W_{12n+4-12(4D+1),A},$
$W_{12n+4-12(5D+1),B}, W_{12n+5-12(6D+1),A},$
$W_{12n+5-12(7D+1),B},$
...
$Q_{12n-12(12D)}, Q_{12n+1-12(13D)}, Q_{12n+2-12(14D)},$
$Q_{12n+3-12(15D)},$
...
$W_{12n+10-12(24D),A}, W_{12n+10-12(25D),B},$
$W_{12n+11-12(26D),A}, W_{12n+11-12(27D),B},$
$P_{12n}, P_{12n+1}, P_{12n+2}, P_{12n+3})$

An interleaver 11 includes delay circuits, each having a one word delay for the even-numbered transmission channels in the 32 data sequences and first and second check words, and inverters 12, 13, 14 and 15 which invert the second check word sequences. Interleaver 11 acts to prevent errors that occur between the error correcting blocks from easily becoming an uncorrectable number of words. Inverters 12 through 15 are provided to avoid misoperation of the data such that all data within one error correcting block does not become "0" due to dropout of bits upon transmission of the data. Furthermore the data is verified as correct in the reproducing system. Similarly, and for the same reason, it may be possible to insert inverters in the first check word sequences.

The data derived from the 24 PCM data and 8 check words sequences are respectively arranged serially every 32 words, and have added at the beginning of each series a synchronizing signal SYNC of 16 bits so as to form one transmission block, as shown in FIG. 2, which is then transmitted. In FIG. 2, a word derived from ith transmission channel is indicated as $u_i$. Practical applications of transmission systems using such a transmission channel include a magnetic recording/reproducing apparatus and a rotary disc.

Encoder 8 provides error correcting codes as described heretofore, where n=28, m=8, and k=4. Similarly, encoder 10 provides error correcting codes where n=32, m=8, and k=4.

Figure 3A:
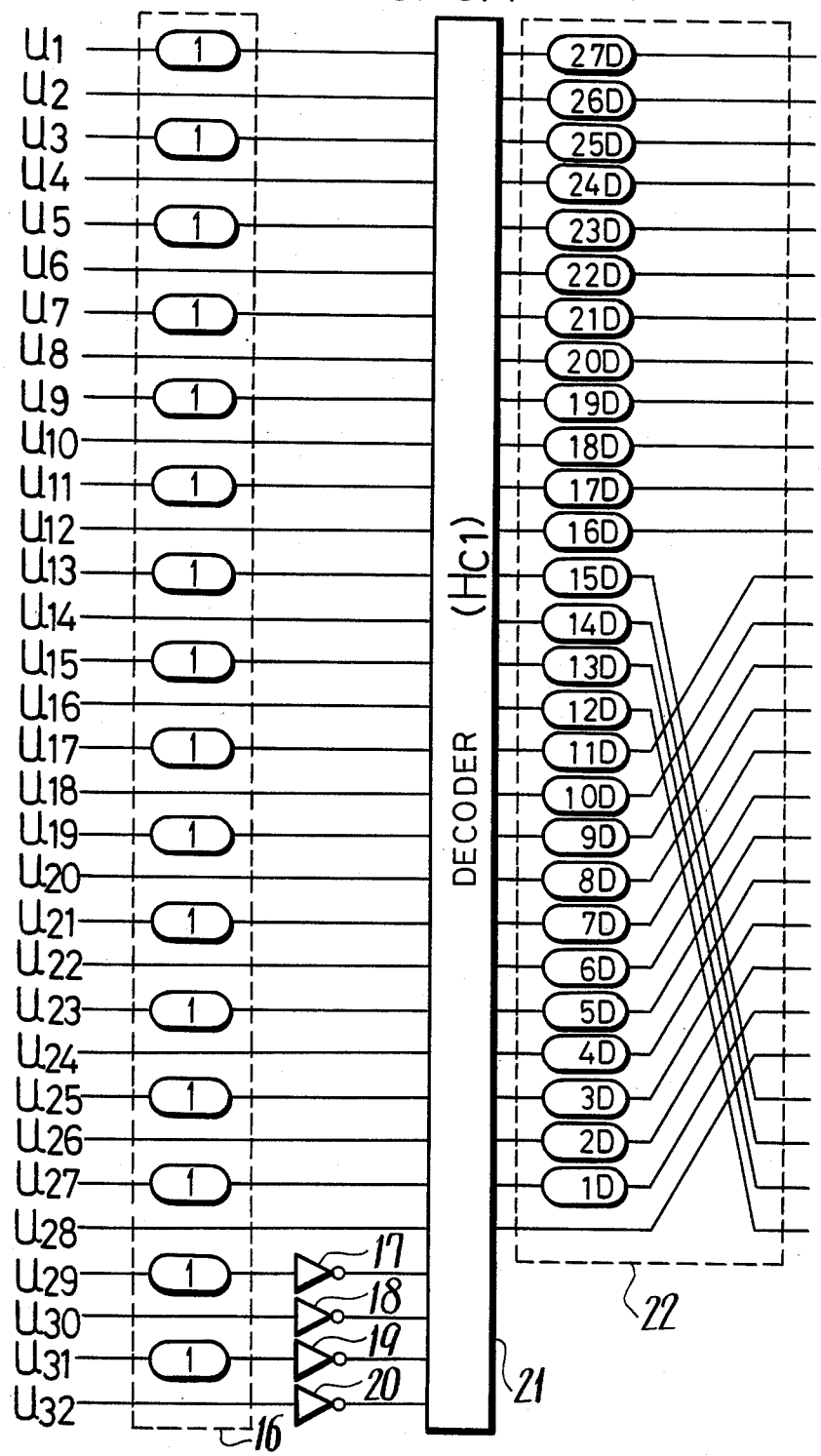

The transmitted data is reproduced and supplied at each 32 word interval, that is, at each transmission block, to inputs of a first stage error correcting decoder shown in FIG. 3A. The reproduced data may or may not contain errors. If no error exists, the 32 words inputted to the first stage error correcting decoder are coincident with the 32 words appearing at the output of the error correcting encoder. The first stage error correcting decoder which includes a deinterleaver 16 and inverters 17, 18, 19 and 20 performs a deinterleave, which corresponds to the interleave done by interleaver 11 during error correcting encoding, so as to recover and place the data in its second arrangement state and to allow the error to be corrected.

The deinterleaver 16 has one word delay circuits in the first stage error correcting decoder for the odd-numbered transmission channels. Inverters 17, 18, 19 and 20 are also provided therein to invert and thereby cancel the previous inversion of for the second check word sequences which allow the data sequences and the first and second check word sequences which form the second error collecting block of data to be supplied to a decoder 21 of the first stage of decoding. As shown in FIG. 4, decoder 21 produces syndromes $S_{10}$, $S_{11}$, $S_{12}$ and $S_{13}$ which are the product of parity check matrix $H_{c1}$ and the 32 word vector $(V_T)$ and applies the syndromes so as to carry out the error correction where $\alpha$ represents a element of $GF(2^8)$ expressed as $F_{(x)} = x^8 + x^4 + x^3 + x^2 + 1$. Decoder 21 produces 24 PCM data and 4 check word sequences, wherein each of the data sequences has added to each a pointer of at least one bit indicating the presence or absence of error (if an error exists, a "1" bit is added, a "0" bit is added).

As used in the present specification and claims, the term "pointer" shall be deemed synonymous with the term "indicator".

In FIG. 4, and FIG. 5, which will be described later, and in the following descriptions, the received word $W_i$ is simply expressed as $\hat{W}_i$.

The output data sequences from decoder 21 are supplied to a deinterleaver 22. Deinterleaver 22 serves to cancel the delays done by interleaver 9 during error correcting encoding, in which the respective transmission channels from 1st to 27th are provided with delay circuits having different delay times such as 27D, 26D, 25D, ..., 2D, 1D. As shown in FIGS. 3A and 3B, the deinterleaver 22 are supplied to a next stage of decoding which includes a decoder 23. In decoder 23, as shown in FIG. 5, syndromes $S_{20}$, $SA_{21}$, $S_{22}$ and $S_{23}$, which are generated by parity check matrix $H_{c2}$ and a 28 word vector $V^T$, are applied thereto and based on matrix $H_{c2}$ and vector $V^T$ the error correction is performed.

The data sequences appearing at the output of decoder 23 are supplied to an even-odd deinterleaver 24. In even-odd deinterleaver 24, the PCM data sequences formed of even-numbered words and the PCM data sequences formed of odd-numbered words are rearranged to form alternating transmission channels. Additionally, one word delay circuits are provided for the PCM data sequences formed of odd-numbered words. Accordingly, even-odd deinterleaver 24 produces at its output the PCM data sequences having the same arrangement states and transmission channels of the same predetermined order as those supplied to interleaver 1 during error correcting encoding. Although not shown in FIG. 3, even-odd deinterleaver 24 is followed by a correcting or interpolating circuit, in which interpolation, such as, a mean value interpolation is performed to conceal an error which is uncorrectable by the decoders 21 and 23.

In one example of this invention, decoder 21 in the first stage of decoding corrects one word errors and two word errors, and detects for errors of more than three words. At the same time, words to be corrected and detected are added with pointers of three kinds which show the presence of errors and are different from one another. Taking a 2-bit pointer as an example, when one word error is corrected, all 32 words or all 28 words other than the four check words within the error correcting block are added with a pointer of [01]. When two word errors are corrected, the respective words are added with a pointer of [10], while when the errors of more than three words are detected, a pointer of [11] is added thereto. Of course, when no error is detected, a pointer becomes [00].

Also, a pointer of 3 bits may be employed. In this case, when no error is detected, a pointer pattern of [000] is used; when one word error is corrected, [001]; when two word errors are corrected, [010]; and when the errors more than three words are detected, [100]. It should be noted that the number of kinds of pointers is not limited to three and other suitable pointers, as are well known in the art, can be used. For example, pointers of two kinds can be used where the pointers distinguish between correction of at least one word errors and detection of more than two word errors.

These pointers are added to respective words, processed by deinterleaver 22 and supplied to decoder 23 which is included within the following stage of decoding. As will be mentioned later, during this next stage of which includes decoder 23, pointers are added to data words or cleared. In the interpolating or correcting circuit, based upon the remaining pointers, the correcting operation is performed on those words which have been uncorrected by decoders 21 and 23.

Decoder 23 utilizes the number of the error words indicated by the aforesaid pointers or the error locations so as to carry out the error correction.

Figure 6:
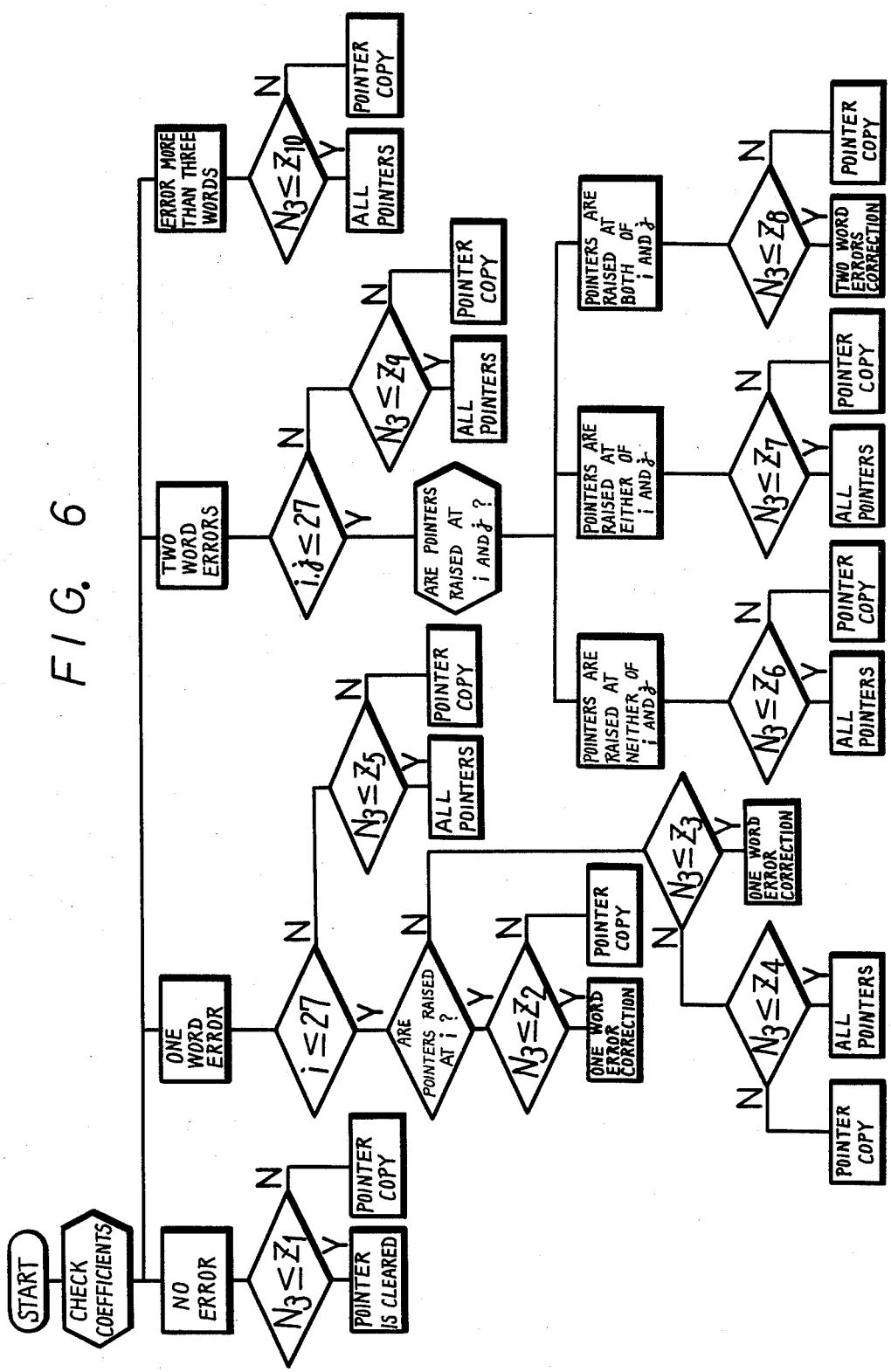
FIGS. 6 through 8 are flow charts which explain in greater detail the operation of the decoder, partially modified from the error correcting decoder of this invention.

FIG. 6 shows one example of the error correction done by decoder 23. In FIG. 6 and in subsequent explanations, the number of error words indicated by the first pointer in the correction of one word errors is represented by $N_1$; the number of error words indicated by the second pointer which has been added in the correction of two word errors is represented by $N_2$; and the number of error words indicated by the third pointer which has been added in the detection of errors of more than three words is represented by $N_3$. Other kinds of pointers and their respective numbers, such as pointers which detect errors of more than two words, can be included in or substituted for the kinds of pointers disclosed heretofore. Additionally, in FIGS. 6-8, values recited for $Z_1$-$Z_{12}$ are merely defined for purpose of description and are not limited to these predetermined reference values. Also in FIG. 6, character Y indicates an affirmative or yes response, while character N iniates a negative or no response. Since decoder 23 corrects up to two word errors, it is preferable to use the modified algorithm for the error correction algorithm. In other words, in the start or beginning of the flow chart shown in FIG. 6, the foregoing error location polynomial $(A\alpha^{2i}+B\alpha^{i}+C=0)$ is calculated to allow the error correction to be performed using these coefficients A, B, C and the syndromes $S_{20}$ to $S_{23}$. At the same time, each of the total numbers $N_1$, $N_2$ and $N_3$ of the first, second and third pointers contained in one block is counted. Alternatively, it may be possible to employ the fundamental algorithm, which uses the syndromes to detect of the absence of error, one word errors and two word errors in a step by step method. As shown in FIG. 6, a method of error correction performed by decoder 23 includes the steps of:

(1) Check the presence or absence of error. When $A=B=C=0$, $S_{20}=0$, and $S_{23}=0$ are satisfied, the absence of error is temporarily recognized and $N_3$ is checked to see if it is less than or equal to $z_1$ ($N_3 \leq z_1$). If $N_3 \leq z_1$ is satisfied, decoder 23 judges that no error exists resulting in the pointer within the error correcting block being cleared. If $N_3$ is greater than $z_1$ ($N_3 > z_1$), the detection of error as determined by the syndromes is judged as incorrect and the pointers are not cleared but rather copied. Pointer copying can also occur for correction of one and two word errors and for detection of more than three words in error. Generally, however, pointer copying does not occur for correction of a one word error inasmuch as the probability is quite small that correction of a one word error is erroneous. The value of $z_1$ is typically quite large and is generally in a range from about 10 to 14.

(2) Check whether the error is a one word error or not. When $A=B=C=0$, $S_{20}\neq 0$, and $S_{23}\neq 0$ are satisfied, the error is judged temporarily to be a one word error. Hence the error location i is searched from $S_{21}/S_{20}=\alpha^i$. Additionally, the error location i is checked to determine whether it is included in a range from 0 to 27. If the error location i is not within this range, the correction of a one word error is impossible and $N_3 \leq z_5$ is then tested in which the value of $z_5$ is defined as 3 or 5. That is, when i is greater than 27, there has been an erroneous detection of a one word error. If $N_3 \leq z_5$, then the number of the pointers is so small that all the words included within the error correcting block are added with the third pointer (all pointers). When $N_3$ is greater than $z_5$ ($N_3 > z_5$), the pointer copying operation is carried out as described heretofore.

If $i \leq 27$, then the pointer is checked to see if it is raised at error location i. In this case, the pointers added in the correction of two word errors and in the detection of more than three word errors are also tested. If the pointer is raised at error location i, then $N_3$ is tested to determine if it is less than or equal to $z_2$ ($N_3 \leq z_2$). The value of $z_2$ can be, for example, 10. If $N_3 \leq z_2$ is established, the error is judged as a one word error to allow the error correction to be carried out by the use of $e_i=S_{20}$. If $N_3$ is greater than $z_2$ ($N_3>z_2$), the number of the pointers is so great that it is dangerous to judge the error as a one word error. Thus so the pointers are not cleared but rather are copied in the pointer copying operation.

When the second and third pointers are not raised at the error location i, $N_3$ is checked to determine if it is less than or equal to $z_3$ ($N_3 \leq z_3$). The check of $N_3 \leq z_3$ is made even when the first pointer is raised at error location i. Typically the value of $z_3$ is a fairly small number, for example, 3. When $N_3 \leq z_3$ is satisfied, by the calculations of the syndromes, a one word error at error location i is corrected.

When $N_3$ is greater than $z_3$ ($N_3 > z_3$), $N_3$ is checked to see if it is less than or equal to $z_4$ ($N_3 \leq z_4$). In other words, when $z_3 < N_3 \leq z_4$ is satisfied, there has been an erroneous judgement of a one word error by the syndromes and $N_3$ is judged as too small, so that the pointers of all words within the error correcting block are raised. However, when $N_3$ is greater than $z_4$, the pointers remain as they are and are copied. The value of $z_4$ can be, for example, equal to 3 or 4.

In determining whether or not $N_3 \leq z_2$ is established, the number $N_2$ of the second pointer may be taken into consideration. For example, numbers $N_2$ and $N_3$ both can be weighted wherein number $N_2$ of the second pointer is weighted less than the number $N_3$ of the third pointer and then the total numbers of both are compared with each other.

(3) Check whether the errors are two word errors or not. If two word errors exist, the error locations i and j are detected by the calculations. When $A \neq 0$, $B \neq 0$, and $C \neq 0$ are established and $D^2/E = \alpha^{-t} + \alpha^t$ are also established wherein t is in the range from 1 to 27, the error is judged as two word errors and error locations i and j are searched by $\alpha^i = D/X$ and $\alpha^j = D/Y$. Error locations i and j are then checked to determine whether both belong in the range from 0 to 27 or not. When the error locations i and j are not within this range, the correction of two word errors is impossible and $N_3$ is tested to see if it is less than or equal to $z_9$ ($N_3 \leq z_9$).

The value of $z_9$ is given as above 2 to 3. When $N_3 \leq z_9$ is satisfied, for the erroneous detection of two word errors, the number of the pointers is so small that all the words included within the error correcting block are added with the third pointer (all pointers). When $N_3$ is greater than $z_9$ ($N_3 > z_9$), the pointer copying operation is performed.

However, when error locations i and j are both within the range from 0 to 27, pointers i and j are checked to see if they are raised. In this case, inasmuch as the probability that the detection of two word errors is erroneous is higher than that of the detection of one word errors, only the third pointer is checked. When the pointer is raised in neither of the error locations i and j, $N_3$ is checked to see if it is less than or equal to $z_6$ where the value of $z_6$ is, for instance, 2. When this condition is satisfied, that is, when the pointers are raised in neither of the error locations i and j, and inasmuch as the number of the pointers is so small, all the words within the error correcting block are added with the third pointer (all pointers). Additionally, when $N_3$ is greater than $Z_6$ ($N_3 > z_6$), the pointer copying operation is carried out.

When the error pointer is raised at either of the error locations i and j, $N_3$ is checked to see if it is less than or equal to $z_7$ ($N_3 \leq z_7$) (where the value of $z_7$ is, for instance, 3. If the above condition is satisfied, all words contained in the error correcting block are added with the third pointer. If not, the pointer copying operation is carried out.

When the pointers are raised at both of the error locations i and j, $N_3$ is checked to see if it is less than or equal to $z_8$ ($N_3 \leq z_8$) (where the value of $z_8$ is, for example, 4). If $N_3 \leq z_8$ is established, the error correction of two word errors at error locations i and j is performed. This correction is effected by searching the error patterns $e_i$ and $e_j$ as described heretofore. When $N_3$ is greater than $z_8$ ($N_3 > z_8$), it is judged that there is a high probability that errors in more than three words have been erroneously detected as two word errors. Thus no error correction is performed and the pointers are copied.

(4) When none of the above conditions (1), (2), and (3) or when errors exceeding two words exist, no error correction is performed. $N_3$ is then checked to see if it is less than or equal to $z_{10}$ ($N_3 \leq z_{10}$). If $N_3 \leq z_{10}$ is satisfied, reliability of the pointer is judged to be low so that the all pointer operation is carried out. If $N_3$ is greater than $z_{10}$, then the pointers remain unchanged and are copied. The value of $Z_{10}$ can be, for example, 3.

Figure 7:
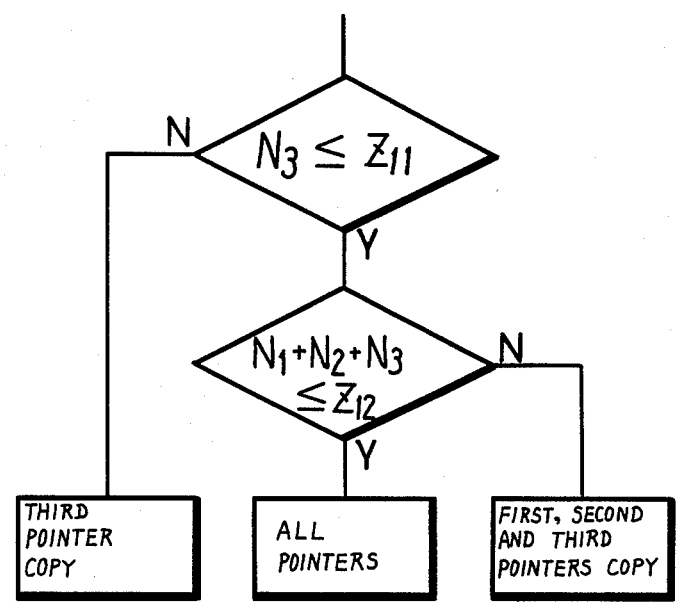
Figure 8:
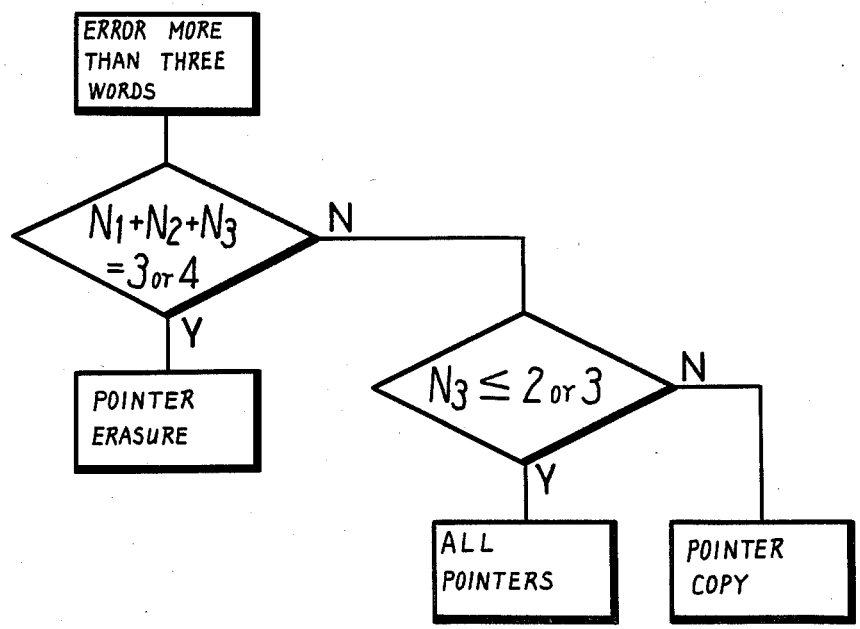

FIGS. 7 and 8 are flow charts illustrating a partial modification or variant of the error correction at the next decoder.

While in FIG. 6, only the all pointer and pointer copying operations were utilized, by taking into consideration the numbers of the first and second pointers a finer processing is possible.

As shown in FIG. 7, initially, $N_3$ is checked to see if it is less than or equal to $z_{11}$ ($N_3 \leq z_{11}$). When $N_3 > z_{11}$ there are a number of error words and only the third pointer remains same. However, when $N_3 \leq z_{11}$ is established, the sum of $N_1 + N_2 + N_3$ is tested to see if it is less than or equal to $Z_{12}$, that is, if $N_1 + N_2 + N_3 \leq z_{12}$, where the value of $z_{11}$ is given as about 4, and the value of $z_{12}$ is as large as about 10. When the above relation or condition is satisfied, it is judged that the pointer is low in reliability such that all the words contained in the error correcting block are added with the third pointer. When $N_1 + N_2 + N_3 + z_{12}$ is established, the reliability of the pointer is judged as high so that the first, second and third pointers all remain same.

As illustrated in FIG. 8, when errors of more than three words are detected, using the error locations i, j and k or i, j, k and l, as indicated by the pointers, a pointer erasure operation may be available for the correction of three word or four word errors. More particularly, when the error is judged as more than three words, the sum of the numbers of the first, second and third pointers is checked to see if it is equal to 3 or 4. When $N_1 + N_2 + N_3 = 3$ (or 4) is established, the error locations i, j, k and (l) indicated by these pointers are used to search the error patterns. Unless the condition or relation of the above equation is satisfied, $N_3$ is checked to see if it is less than 2 (or 3). When $N_3$ is less than or equal to 2 (or 3) ($N_3 \leq 2$ or 3), for the error of three words or more, the number of error words indicated by third pointers is so small that the reliability of the third pointers is judged to be low, so that all the words are added with the third pointers. When $N_3$ is greater than 2 or 3 ($N_3 > 2$ or 3), the second and third pointers or the third pointer remains same. As described above, in the pointer erasure operation, by the use of the first pointer, it is possible to reduce the probabilities of the erroneous correction and the uncorrectable correction.

In the error correcting decoder shown in FIG. 3 and as described heretofore, error correction is performed by using each of first check words $Q_{12n}$, $Q_{12n+1}$, $Q_{12n+2}$ and $Q_{12n+3}$ and second check words $P_{12n}$, $P_{12n+1}$, $P_{12n+2}$ and $P_{12n+3}$ once. If, however, the respective error corrections are performed more than twice (typically in practice, about twice), errors are further reduced such that a greater error correcting ability is possible. Additionally, when a decoder is further provided at a later stage as described above, decoders 21 and 23 are required to correct the check words.

Although in the above embodiment interleaver 9 has delay times in its delay wherein each channel thereon is different by D from each adjacent channel, the delay times between adjacent channels can be different. That is, the delay times between, at least, one pair of adjacent channels can be different from the delay times between any other pair of adjacent channels. As disclosed previously second check word $P_i$ has an error correcting code consisting of the PCM data and first check word $Q_i$. Similarly, first check word $Q_i$ can contain second check word $P_i$ by providing, for example, a feedback path of second check word $P_i$ to the encoder which generates the first check word. The feedback arrangement is effective when decoding more than three times and, in particular, when a greater error correcting ability is desired.

In accordance with the invention as described heretofore, the burst error is dispersed by the cross-interleave technique so that random and burst errors can be corrected effectively. Moreover, when decoding operations of more than two stages are carried out and if the pointers of plural kinds are added in the first stage and the difference in reliability among such pointers is taken into consideration it is possible to further reduce the probability of erroneous correction and of an uncorrectable error.

While in the embodiment of this invention, the error correcting code uses the adjacent codes, it may be possible to employ an error correcting code which can correct one word error and detect up to two word errors.

Having described a specific embodiment of the invention with reference to the accompanying drawings, it is to be understood that many modifications and variations may be effected therein by one skilled in the art without departing from the spirit or scope of the invention which is to be determined by the appended claims.

We claim as our invention:

1. An improved method of error correcting words of pulse code modulated data which are encoded in first and second error correcting blocks, said first error correcting block containing said words of data in a plurality of channels forming a first arrangement state and first check words associated therewith and said second error correcting block containing said first arrangement state and first check words, delayed at each channel by different delay times to form a second arrangement state, and second check words associated therewith; and in which said encoded data is decoded by initially decoding said second error correcting block in a first stage, delaying each channel of said second arrangement state by different delay times so as to reform said first error correcting block and subsequently decoding the reformed first error correcting block so as to again place said data in said first arrangement state: said improved method of error correcting comprising the steps of correcting at least one word errors and detecting more than two word errors contained in said second error correcting block during said initial decoding;

adding indicators of at least first and second kinds which respectively indicate correction of one word errors and detection of errors of more than two words, said indicators being added to at least corresponding erroneous words within said second error correcting block during said initial decoding;

correcting at least one word errors contained in said first error correcting block during said subsequent decoding; and determining the kinds of said pointers and their respective numbers thereof contained in said first error correcting block during said subsequent decoding so that in accordance with the results of said determination all remaining errors are detected and corrected and erroneous error correction is avoided.

2. A method of error correcting as in claim 1; wherein, during said initial decoding, two word errors contained in said second error correcting block are corrected and more than three word errors contained in said second error correcting block are detected; said second kind of indicator indicates detection of errors of more than three words, and a third kind of indicator is added for indicating correction of two word errors; and wherein, during said subsequent decoding, two word errors contained in said first error correcting block are also corrected.

3. A method of error correcting as in claim 2; wherein the number of error words associated with said second kind of indicator, contained in said first error correcting block, is compared during said subsequent decoding with predetermined reference values in judging the reliability of said indicators and in determining whether error correction is possible.

4. A method of error correcting as in claim 2; wherein, during said subsequent decoding, if erroneous data remains uncorrected, either said second kind of indicator is added to all words in said first correcting block or, alternatively, indicators added during said initial decoding are left unchanged, in dependence on the degree of reliability of said indicators in said first error correcting block.

5. A method of error correcting as in claim 1; wherein, during encoding of said data, which data is characterized by even and odd numbered words, said data is applied to an interleaver which shifts the channel position of said data such that said even numbered words are grouped together and said odd numbered words are grouped together in said plurality of channels.

6. A method of error correcting as in claim 5; wherein, during encoding of said data, said first check words are interposed between said grouped even numbered words and said grouped odd numbered words.

7. A method of error correcting as in claim 1; wherein the number of error words associated with one of said indicators of at least first and second kinds, contaned in said first error correcting block, is compared during said subsequent decoding with predetermined reference values in judging the reliability of said indicators and in determining whether error correction is possible.

8. A method of error correcting as in claim 1; wherein, during said subsequent decoding, if erroneous data remains uncorrected, either one of said pointers of at least first and second kinds is added to all words contained in said first error correcting block or, alternatively, indicators added during said initial decoding are left unchanged in dependence on the degree of reliability of said indicators in said first error correcting block.

9. An improved method of error correcting words of pulse code modulated data and check words associated therewith encoded in at least one error correcting block, wherein said data words of said at least one error correcting block may contain at least two types of error condition, said method of error correcting comprising the steps of:
- detecting the presence of any of said types of error condition in said data words of said at least one error correcting block;
- adding a selected one of a plurality of indicators to respective ones of said data words contained in said error correcting block, each indicator consisting of plural bits and corresponding to and identifying a respective one of said types of error condition, each indicator being added in response to the detected presence of the respective type of error condition;
- discriminating which of said indicators has been added to each of said data words; and
- processing said data words in response to said discrimination to correct or compensate for any error conditions detected in said data words and to avoid erroneous error correction.

10. A method of error correcting as in claim 9; said method including the steps of:
- initially decoding said at least one first error correcting block, said step of initially decoding including said step of detecting said presence of said types of error condition and said step of adding said indicators;
- subsequent to said step of adding said indicators within said step of initially decoding, generating a second error correcting block in response to said decoded at least one first error correcting block, said second error correcting block including a data word from each of a plurality of said at least one first error correcting blocks and second check words associated therewith; and
- subsequently decoding said second error correcting block, said step of subsequently decoding including said step of discriminating and said step of processing.

11. A method of error correcting as in claim 10; wherein said step of subsequently decoding further includes the steps of:
- determining the kinds of said indicators and their respective numbers which were added in said step of initially decoding of said at least one first error correcting block; and
- judging, in dependence on the results of said determination, whether error correction is to be performed.

12. A method of error correcting as in claim 11; wherein certain ones of said indicators have a higher degree of reliability than others of said indicators, and wherein said step of judging is performed in response to the number of the most reliable of the pointers added to said at least one first error correcting block.

13. A method of error correcting as in claim 10; wherein certain ones of said indicators have a higher degree of reliability than others of said indicators, and, when erroneous data is not corrected in said step of subsequently decoding, either a selected one of said indicators is added to all words in said second error correcting block or, alternatively, said indicators added during said initial decoding are left unchanged, in dependence on the degree of reliability of said indicators added to said at least one first error correcting block.

* * * * *